United States Patent [19]

Sugawara

[11] Patent Number: 5,194,766
[45] Date of Patent: Mar. 16, 1993

[54] MULTI-LEVEL LOGIC INPUT CIRCUIT
[75] Inventor: Mitsutoshi Sugawara, Tokyo, Japan
[73] Assignee: NEC Corporation, Tokyo, Japan
[21] Appl. No.: 791,243
[22] Filed: Nov. 13, 1991
[30] Foreign Application Priority Data
  Nov. 14, 1990 [JP] Japan .................... 2-307692
[51] Int. Cl.⁵ .................... H03K 19/00; H03K 19/094
[52] U.S. Cl. .................... 307/473; 307/454; 307/451; 307/361
[58] Field of Search ............ 307/473, 451, 454, 474, 307/475, 361

[56] References Cited

U.S. PATENT DOCUMENTS

| | | | |
|---|---|---|---|
| 3,950,656 | 4/1976 | Sumida et al. | 307/473 |
| 3,969,633 | 7/1976 | Paluck et al. | 307/473 |
| 4,588,908 | 5/1986 | Reich et al. | 307/474 |
| 4,591,739 | 5/1986 | Nagano | 307/475 |

Primary Examiner—David Hudspeth
Assistant Examiner—Richard Roseen
Attorney, Agent, or Firm—Sughrue, Mion, Zinn, Macpeak & Seas

[57] ABSTRACT

A multi-level logic input circuit is composed of a first and a second resistor, a first polarity current mirror circuit whose input is connected to the first resistor and which has a plurality of output nodes, and a second polarity current mirror circuit whose input is connected to the second resistor and which has a plurality of output nodes. The output nodes of the first polarity current mirror circuit are connected correspondingly with the output nodes of the second polarity current mirror circuit. The output nodes are led out as a plurality of output terminals. At least one of the output nodes of each of the current mirror circuits has a current ratio different from that in all the remaining output nodes thereof. The multi-level logic input circuit is simple in its configuration, and it enables to realize multi-level inputs with small current consumption.

5 Claims, 2 Drawing Sheets

FIG.1A
PRIOR ART
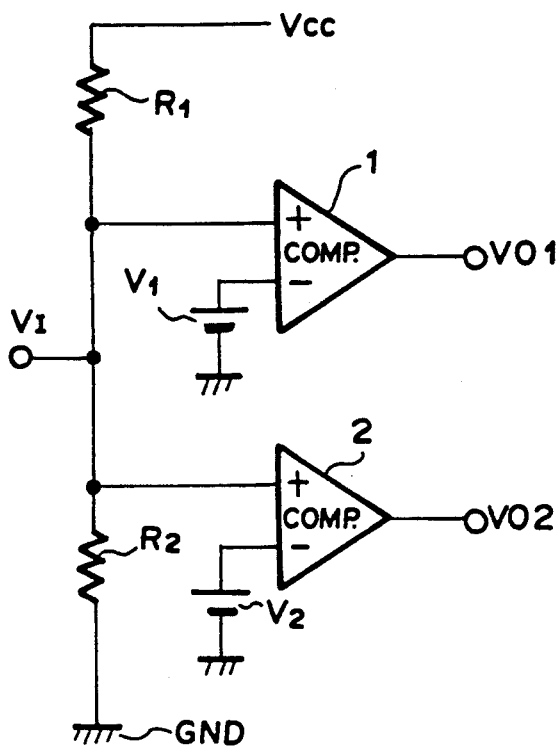
FIG.1B
PRIOR ART
| INPUT $V_I$ | OUTPUT $V_{O1}$ | OUTPUT $V_{O2}$ |
|---|---|---|
| H | H | H |
| M | L | H |
| L | L | L |
FIG.2
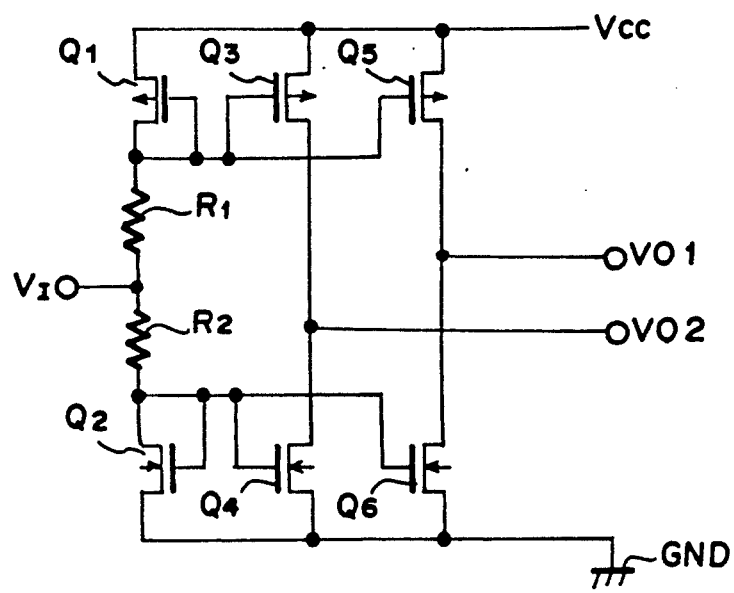

F I G. 3
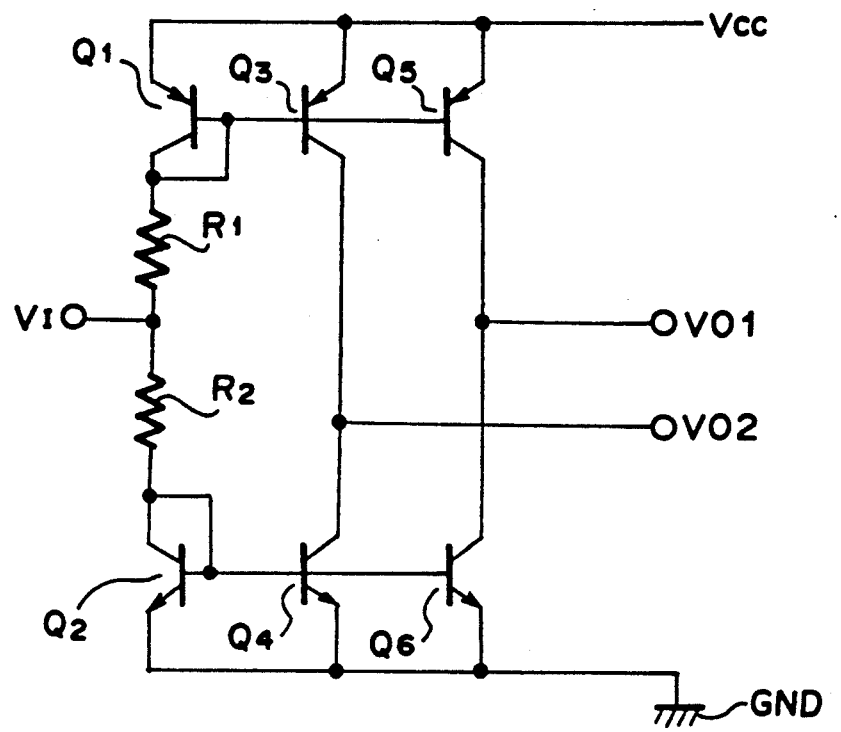
F I G. 4
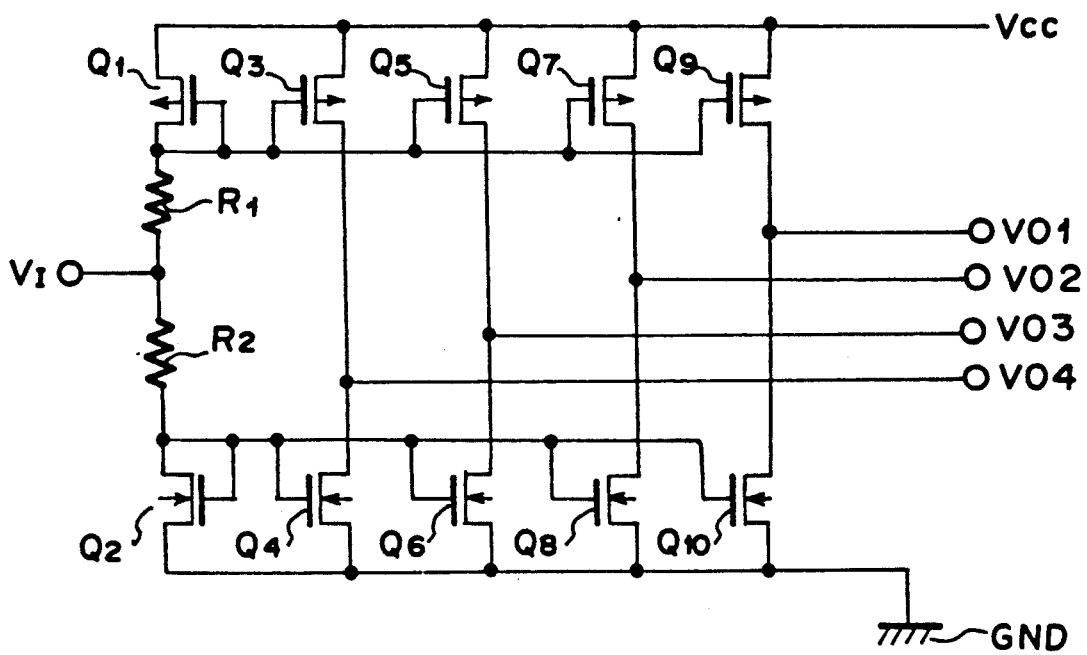

5,194,766

MULTI-LEVEL LOGIC INPUT CIRCUIT

BACKGROUND OF THE INVENTION

(1) Field of the Invention

The present invention relates to a logic circuit and, more particularly, to a logic circuit to which a digital value of multi-level logic data is inputted and from which a digital value of two-valued logic data is outputted.

(2) Description of the Prior Art

Only the input part is often made to have a multi-level logic input configuration and this is done for enabling to input data of as many different states as possible within the limited number of chip pins of an LSI (Large-scale integrated circuit). For example, where there are provided two input pins for receiving the input signals of three levels including an intermediate level (M) in addition to a low level (L) and a high level (H), it is possible to have them deal with nine different combinations of inputs ($3\times 3=9$), which combinations are larger than twice as compared to those in an ordinary two-level (or two-valued) input configuration ($2\times 2=4$).

Conventionally, as shown in FIG. 1A, the inputs $V_I$ and each of the threshold values $V_1$, $V_2$ are compared by a comparator 1 and a comparator 2 which have different threshold values with each other and the results are outputted to output terminals $V_{01}$ and $V_{02}$ as two-valued logic data. FIG. 1B is a truth table for such inputs and outputs.

As such comparators 1 and 2, there have often been used a pair of differential amplifiers or a pair of inverters having different threshold values with each other. In such arrangement, in order to be able to achieve three different level inputs, that is, to have the input connected to ground (L), allowed to be in an open state (M), and connected to a power source (H), a bias voltage corresponding to the potential of intermediate level (M) is applied by resistors $R_1$ and $R_2$.

Generally, in the case of the comparator using a differential amplifier, it is necessary that the constant current be always supplied to the comparators and this results in such disadvantages that power is always consumed accordingly and also that such circuitry as a load circuit becomes complex in order to secure an appropriate dynamic range in the outputs.

In the case of the inverters having different threshold values, power is not consumed in the CMOS inverters when the input level applied thereto is "L" or "H". However, there is a defect that, when the input level applied thereto is at the intermediate level (M), an N-channel transistor and a P-channel transistor constituting the inverter are caused to be turned on at the same time thereby allowing a large current to flow therein as the so-called "through current".

SUMMARY OF THE INVENTION

Therefore, the present invention aims at providing a multi-level logic input circuit which is simpler in its construction and which can operate under low power consumption as compared with the conventional ones.

In summary, the multi-level logic input circuit according to the present invention adopts two current mirror circuits whereby the desired multi-level logic input is made possible.

According to one aspect of the invention, there is provided a multi-level logic input circuit which comprises:

a first resistor whose one end is connected to an input terminal;

a second resistor whose one end is connected to the input terminal;

a first polarity current mirror circuit whose input is connected to the other end of the first resistor and which has a plurality of first output nodes; and a second polarity current mirror circuit whose input is connected to the other end of the second resistor and which has a plurality of second output nodes, the first output nodes of the first polarity current mirror circuit being connected correspondingly with the second output nodes of the second polarity current mirror circuit, all of the output nodes being led out as a plurality of output terminals, and at least one of the output nodes of each of the current mirror circuits having a current ratio different from that in all the remaining output nodes thereof.

BRIEF DESCRIPTION OF THE DRAWINGS

The above and other objects, features and advantages of the present invention will be apparent from the following description of preferred embodiments of the invention explained with reference to the accompanying drawings, in which:

FIG. 1A is a circuit diagram showing a conventional multi-level logic input circuit;

FIG. 1B is a truth table of inputs and outputs in the conventional circuit shown in FIG. 1A; and FIG. 2 is a circuit diagram of a multi-level logic input circuit of a first embodiment according to the invention;

FIG. 3 is a circuit diagram of a multi-level logic input circuit of a second embodiment according to the invention; and FIG. 4 is a circuit diagram of a multi-level logic input circuit of a third embodiment according to the invention.

DESCRIPTION OF THE PREFERRED EMBODIMENTS

Throughout the following explanation, the same reference symbols or numerals as those of the conventional circuit shown in FIG. 1A refer to the same or similar elements of the multi-level logic input circuits according to the invention.

FIG. 2 shows a multi-level logic input circuit of a first embodiment according to the invention. An input terminal $V_I$ is connected to a junction node of serially connected resistors $R_1$ and $R_2$ which are respectively connected to transistors $Q_1$ and $Q_2$ each constituting an input stage of the current mirror circuit concerned. When the input terminal $V_I$ is at its open state, a bias current is flowing through a route from the power source $V_{CC}$ to the transistor $Q_1$, the resistors $R_1$, $R_2$ and the transistor $Q_3$.

It is assumed that the current ratios of the current mirror circuits (or the ratios of sizes of the transistors or the ratios of conductance gm thereof) are as follows:

$Q_1:Q_3:Q_5 = 1:1:2$, $Q_2:Q_4:Q_6 = 1:2:1$.

When the input terminal $V_I$ is at its open state, since the current-sink capability of the transistor $Q_4$ is larger than that of the transistor $Q_3$, the transistor $Q_3$ causes the same current as in the transistor $Q_1$ to flow at a pentode characteristic region and the transistor $Q_4$ causes the same current as in the transistor $Q_3$ to flow at a triode characteristic region whereby the transistor $Q_4$ turns to a small drain-source voltage state and, consequently, an output terminal $V_{O2}$ becomes "L". Likewise, the terminal $V_{O1}$ becomes "H". Here, the current consumption may be given by the following formula:

$$3 \times \frac{V_{CC} - |V_{GS1}| - V_{GS2}}{R_1 + R_2}$$

wherein $V_{GS1}$ and $V_{GS2}$ represent gate-source voltages of the transistors $Q_1$ and $Q_2$, respectively. Each of such voltages is roughly in the order of 1 V.

Next, assuming that the input terminal $V_I$ is at low potential (L) or is grounded, the current which flows in the current mirror circuit formed by the transistors $Q_2$, $Q_4$ and $Q_6$ becomes substantially 0 (zero). On the other hand, the current which flows in the transistor $Q_1$ is given by the following formula:

$$\frac{V_{CC} - |V_{GS1}|}{R_1}$$

This current is substantially twice as large as that in the state wherein the input terminal $V_I$ is at the open state, and this current causes the transistors $Q_3$, $Q_5$ to turn on. However, since no current flows to the transistors $Q_4$, $Q_6$, no current flows to these transistors $Q_3$, $Q_5$, either, so that both the output terminal $V_{O1}$ and the output terminal $V_{O2}$ become "H".

Likewise, if the input $V_I$ is "H", the transistors $Q_1$, $Q_3$ and $Q_5$ turn off and the transistors $Q_2$, $Q_4$ and $Q_6$ turn on, so that both the output terminal $V_{O1}$ and the output terminal $V_{O2}$ become "L". The comsumption current at this time may be obtained by the following formula:

$$\frac{V_{CC} - V_{GS2}}{R_2}$$

In the above respective cases, if the amount of current which flows to the resistor $R_1$ or $R_2$ is excluded (this current is also flowing in the conventional circuit shown in FIG. 1A), the current of consumption when the input terminal $V_I$ is at "L" or "H" is substantially zero and that when the input terminal $V_I$ is at the intermediate level (M) is about three times thereof (in the order of 3/2 times of the current which flows to the resistor under the low level "L" or the high level "H"). This value is a value sufficiently small as compared with the through current with the CMOS inverters.

FIG. 3 shows an arrangement wherein the N-channel MOS transistors shown in FIG. 2 are respectively replaced by NPN transistors, and the P-channel MOS transistors by PNP transistors. This circuit formed by the bipolar transistors operates and functions basically the same as in the circuit formed by the MOS field effect transistors shown in FIG. 2.

Since there is a possibility that the transistors $Q_3$, $Q_5$ or the transistors $Q_4$, $Q_6$ enter into a saturated state (triode characteristic region) at the same time, it is desirable that a series resistor be provided to each of the bases of the transistors concerned in order to lessen the influence from the current hogging phenomenon.

FIG. 4 shows an example of 5-level logic input circuit wherein the output nodes of the P-channel type current mirror circuit and the output nodes of the N-channel type current mirror circuit shown in FIG. 2 respectively increased in their numbers are correspondingly connected together, which lead to the respective output terminals as output terminals $V_{O1}$, $V_{O2}$, $V_{O3}$ and $V_{O4}$.

Here, it is assumed that the current ratios are, as example, as follows:

$$Q_1:Q_3:Q_5:Q_7:Q_9 = 1:\tfrac{1}{4}:1:2:5$$

$$Q_2:Q_4:Q_6:Q_8:Q_{10} = 1:5:2:1:\tfrac{1}{4}$$

When the input is "H", the transistors $Q_2$, $Q_4$, $Q_6$, $Q_8$ and $Q_{10}$ all turn off, so that the outputs $V_{O1}$, $V_{O2}$, $V_{O3}$ and $V_{O4}$ all turn to "H". Likewise, when the input terminal $V_I$ is at "H", the output terminals $V_{O1}$, $V_{O2}$, $V_{O3}$, and $V_{O4}$ all turn to "L". Further, it can be readily understood that, when the input terminal $V_I$ is at the open state, the output terminals $V_{O1}$ and $V_{O2}$ turn to "H" but the output terminals $V_{O3}$ and $V_{O4}$ turn to "L".

Next, when a bias is applied to the input terminal $V_I$ in such a way that the input terminal $V_I$ receives a voltage slightly lower than the voltage (normally this is selected to be nearly $V_{cc}/2$) under the open state thereof and yet the transistors $Q_2$, $Q_4$, $Q_6$ and $Q_{10}$ do not turn off, the current-sink capability of the transistors $Q_6$, $Q_8$ and $Q_{10}$ is evidently smaller than the current-force capability of the transistors $Q_5$, $Q_7$ and $Q_9$, so that the output terminals $V_{O1}$, $V_{O2}$ and $V_{O3}$ relating thereto become "H". A current is flowing in the transistor $Q_2$ although the amount thereof is small and the current-sink capability of the transistor $Q_4$ can be up to five times the current of the transistor $Q_2$. As long as this value is larger than the current-force capability of the transistor $Q_3$, the output terminal $V_{O4}$ can be maintained at "L" level. It should be noted that the input level of "slightly low" can be decoded.

Likewise, it is possible to decode the input level of "slightly high" by the transistors $Q_9$ and $Q_{10}$ and to output the decoded result at the output terminal $V_{O1}$. In this way, the circuit of this third embodiment can deal with the input of five levels applied to the input terminal $V_I$, namely, a low level (GND), a slightly low level, an intermediate value (open state), a slightly high level, and a high level ($V_{cc}$).

As explained above, in the circuit according to the present invention (without the bias circuit portion being taken into consideration), a 3-level logic input circuit can be realized by only six transistors wherein the consumption of current is zero at the low level (L) input or the high level (H) input, and it can be in the order of the amount corresponding to the consumption current flowing in the above mentioned bias circuit portion at the intermediate level (M) input. Also, there is no possibility for a large through current to flow unlike in a conventional arrangement using an inverter.

Further, unlike in a conventional arrangement using a differential amplifier, there is no need for the bias current to be constantly supplied to such differential circuit whether under the low level input state or under the high level input state.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A multi-level logic input circuit comprising:
   a first resistor whose one end is connected to an input terminal;
   a second resistor whose one end is connected to said input terminal;
   a first polarity current mirror circuit whose input is connected to the other end of said first resistor and which has an n number of first output nodes; and
   a second polarity current mirror circuit whose input is connected to the other end of said second resistor and which has an n number of second output nodes in common with that of said first output nodes;
   said first output nodes of the first polarity current mirror circuit being connected correspondingly with said second output nodes of the second polarity current mirror circuit, all of said output nodes being led out as a plurality of output terminals, and at least one of said output nodes of each of said current mirror circuits having a current ratio different from that in all the remaining output nodes thereof.

2. A multi-level logic input circuit according to claim 1 in which said first polarity current mirror circuit comprises P-channel MOS transistors and said second polarity current mirror circuit comprises N-channel MOS transistors.

3. A multi-level logic input circuit according to claim 1 in which said first polarity current mirror circuit comprises PNP transistors and said second polarity current mirror circuit comprises NPN transistors.

4. A multi-level logic input circuit according to claim 1 in which said n number of said first output nodes and said second output nodes is two.

5. A multi-level logic input circuit according to claim 1 in which said n number of said first output nodes and said second output nodes is four.

* * * * *